(12) United States Patent
Zhang et al.

(10) Patent No.: US 11,152,763 B2
(45) Date of Patent: Oct. 19, 2021

(54) INP-BASED MONOLITHIC INTEGRATED CHAOTIC SEMICONDUCTOR LASER CHIP CAPABLE OF FEEDING BACK RANDOMLY DIFFUSED LIGHT

(71) Applicant: Taiyuan University Of Technology, Taiyuan (CN)

(72) Inventors: Mingjiang Zhang, Taiyuan (CN); Jianzhong Zhang, Taiyuan (CN); Ya'nan Niu, Taiyuan (CN); Yi Liu, Taiyuan (CN); Tong Zhao, Taiyuan (CN); Lijun Qiao, Taiyuan (CN); Anbang Wang, Taiyuan (CN); Yuncai Wang, Taiyuan (CN)

(73) Assignee: Taiyuan University Of Technology

( * ) Notice: Subject to any disclaimer, the term of this patent is extended or adjusted under 35 U.S.C. 154(b) by 131 days.

(21) Appl. No.: 16/622,061

(22) PCT Filed: Aug. 27, 2018

(86) PCT No.: PCT/CN2018/000305
§ 371 (c)(1),
(2) Date: Dec. 12, 2019

(87) PCT Pub. No.: WO2019/095529
PCT Pub. Date: May 23, 2019

(65) Prior Publication Data
US 2020/0412092 A1    Dec. 31, 2020

(30) Foreign Application Priority Data
Nov. 16, 2017  (CN) .......................... 201711140218.7

(51) Int. Cl.
*H01S 5/12*  (2021.01)
*H01S 5/026*  (2006.01)
(Continued)

(52) U.S. Cl.
CPC ................ *H01S 5/12* (2013.01); *H01S 5/026* (2013.01); *H01S 5/06258* (2013.01); *H01S 5/34373* (2013.01); *H01S 5/4006* (2013.01)

(58) Field of Classification Search
CPC ........... H01S 5/12–125; H01S 5/06258; H01S 5/026; H01S 5/0265; H01S 5/4006; H01S 5/40–4093
See application file for complete search history.

(56) References Cited

U.S. PATENT DOCUMENTS 4,847,856 A *  7/1989  Sugimura ........... H01S 5/06258
                                                              372/96
5,757,840 A *  5/1998  Hiroki .................... B82Y 20/00
                                                              372/27
(Continued)

FOREIGN PATENT DOCUMENTS

CN       1366367 A     8/2002
CN       1710761 A    12/2005
(Continued)

OTHER PUBLICATIONS

Argyris, et al., Photonic Integrated Device for Chaos Applications in Communications, Physical Review Letters, May 2008, pp. 194101-1-194101-4, vol. 100, The American Physical Society.
(Continued)

*Primary Examiner* — Joshua King
(74) *Attorney, Agent, or Firm* — Lerner, David, Littenberg, Krumholz & Mentlik, LLP

(57) ABSTRACT

An InP-based monolithic integrated chaotic semiconductor laser chip capable of feeding back randomly diffused light, being composed of six regions: a left DFB semiconductor laser, a bidirectional SOA, a left passive optical waveguide region, a doped passive optical waveguide region, a right passive optical waveguide region, and a right DFB semiconductor laser, specifically including: an N+ electrode (Continued)

layer, an N-type substrate, an InGaAsP lower confinement layer, an undoped InGaAsP multiple quantum well active region layer, doped particles, distributed feedback Bragg gratings, an InGaAsP upper confinement layer, a P-type heavily doped InP cover layer, a P-type heavily doped InGaAs contact layer, a P+ electrode layer, a light-emitting region, and isolation grooves. It effectively solves problems of bulky volume of the existing chaotic laser source, the time-delay signature of chaotic laser, narrow bandwidth, and low coupling efficiency of the light and the optical waveguide.

8 Claims, 1 Drawing Sheet

(51) Int. Cl.
H01S 5/0625 (2006.01)
H01S 5/343 (2006.01)
H01S 5/40 (2006.01)

(56) References Cited

U.S. PATENT DOCUMENTS

| | | | | |
|---|---|---|---|---|
| 5,901,166 | A * | 5/1999 | Nitta | H01S 5/0625 372/50.1 |
| 6,432,736 | B1 * | 8/2002 | Lee | H01S 5/125 438/29 |
| 10,911,147 | B2 * | 2/2021 | Schrenk | H04B 10/61 |
| 2003/0072346 | A1 * | 4/2003 | Bang | H01S 5/06258 372/96 |
| 2004/0114656 | A1 * | 6/2004 | Kim | H01S 5/06258 372/50.11 |
| 2012/0051386 | A1 * | 3/2012 | Kim | H01S 5/06258 372/96 |
| 2016/0276803 | A1 * | 9/2016 | Uesaka | H01S 5/0687 |
| 2019/0165544 | A1 * | 5/2019 | Suzuki | H01S 5/1218 |
| 2020/0412092 | A1 * | 12/2020 | Zhang | H01S 5/34373 |

FOREIGN PATENT DOCUMENTS

| | | | |
|---|---|---|---|
| CN | 102882127 A | | 1/2013 |
| CN | 102882127 A * | | 1/2013 |
| CN | 104158085 A * | | 11/2014 |
| CN | 104158085 A | | 11/2014 |
| CN | 104377544 A | | 2/2015 |
| CN | 104953468 A | | 9/2015 |
| CN | 104953468 A * | | 9/2015 |
| CN | 105811241 A | | 7/2016 |
| CN | 107658693 A * | | 2/2018 |
| CN | 107658694 A | | 2/2018 |
| CN | 107749564 A * | | 3/2018 |
| CN | 108899759 A * | | 11/2018 |
| CN | 108923251 A * | | 11/2018 |
| CN | 109167250 A * | | 1/2019 |
| CN | 110429471 A * | | 11/2019 |
| JP | H0643515 A * | | 2/1994 |
| JP | H06232844 A * | | 8/1994 |
| JP | 2013016642 A | | 1/2013 |
| WO | WO-02084827 A2 * | 10/2002 | H01S 5/06258 |

OTHER PUBLICATIONS

Chinese Search Report for Application No. 201711140218.7 dated Mar. 15, 2019, pp. 1-2.
Dal Bosco, et al., Dynamics Versus Feedback Delay Time in Photonic Integrated Circuits: Mapping the Short Cavity Regime, IEEE Photonics Journal, Apr. 2017, pp. 1-13, vol. 9, No. 2.
Harayama, et al., Fast nondeterministic random-bit generation using on-chip chaos lasers, Physical Review A, Mar. 2011, pp. 031803-1-031803-4, vol. 83, No. 3, American Physical Society.
International Search Report for Application No. PCT/CN2018/000305, dated Nov. 27, 2018, pp. 1-2.
Qingchun, et al., CN Application No. ZL201210349951.0, filed on Sep. 19, 2012, titled "Photoinjection-type chaotic photonic integration device and preparation method thereof".
Tronciu, et al., Chaos Generation and Synchronization Using an Integrated Source With an Air Gap, IEEE Journal of Quantum Electronics, Dec. 2010, pp. 1840-1846, vol. 46, No. 12.
Wang, et a.l, CN Application No. ZL201110198943.6, filed on Jul. 16, 2011, titled "Optical feedback chaos laser".
Wang, et al., CN Application No. ZL201410435033.9, filed on Aug. 30, 2014, titled "No-time-delay flat-frequency-spectrum broadband photon integrated chaos semiconductor laser".
Wang, et al., Route to broadband chaos in a chaotic laser diode subject to optical injection, Optics Letters, Apr. 2009, pp. 1144-1146, vol. 34, No. 8, Optical Society of America.
Wu, et al., Direct generation of broadband chaos by a monolithic integrated semiconductor laser chip, Optics Express, published Sep. 2013, pp. 23358-23364, vol. 21, No. 20, Optical Society of America.

* cited by examiner

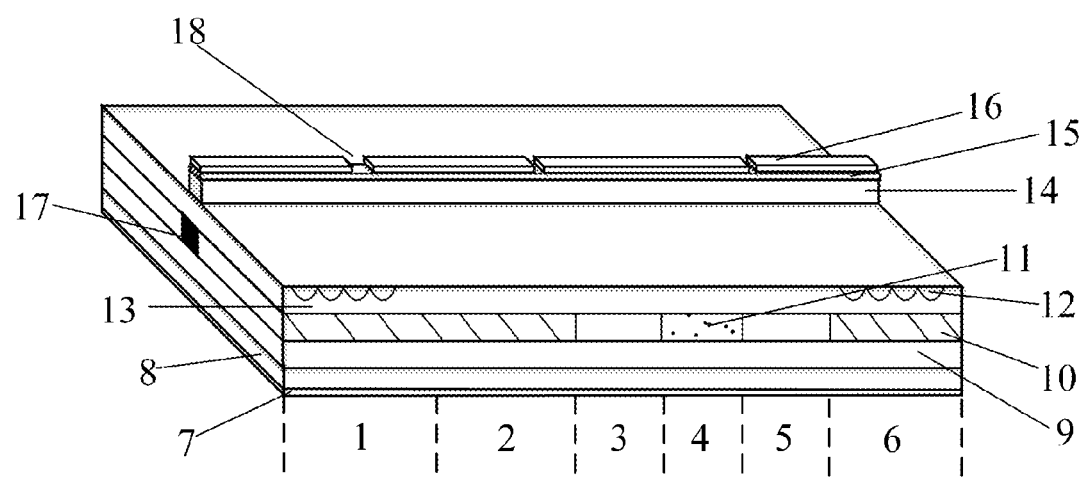

INP-BASED MONOLITHIC INTEGRATED CHAOTIC SEMICONDUCTOR LASER CHIP CAPABLE OF FEEDING BACK RANDOMLY DIFFUSED LIGHT

CROSS REFERENCE TO RELATED APPLICATIONS

The present application is a national phase entry under 35 U.S.C. § 371 of International Application No. PCT/CN2018/000305, filed Aug. 27, 2018, which claims priority from Chinese Patent Application No. 201711140218.7 filed Nov. 16, 2017, all of which are hereby incorporated herein by reference.

TECHNICAL FIELD

The present disclosure relates to an integrated chaotic laser, in particularly, to an InP-based monolithic integrated chaotic semiconductor laser chip capable of feeding back randomly diffused light.

BACKGROUND

In recent years, chaotic lasers have illustrated important application value in the fields of secure communication, radar, high-speed random number generation, distributed optical fiber sensing and fiber network fault detection etc. In order to better apply the chaotic lasers, researchers at home and abroad hope to develop an integrated chaotic laser chip with small volume and stable performance. At present, some achievements have been made in the research on the integrated chaotic laser chip. Internationally, in 2008, Argyris et al. of University of Athens in Greece developed a monolithic integrated chaotic semiconductor laser chip (Argyris A, Hamacher M, Chlouverakis K E, et al. Photonic integrated device for chaos applications in communications [J]. Physical review letters, 2008, 100 (19): 194101.); in December 2010, Annovazzi-Lodi et al. of the University of Pavia, Italy, Mirasso et al. University of the Balearic Islands, Spain, and Hamacher of Fraunhofer Institute for Telecommunications, Heinrich Hertz Institute, Germany, developed a two-feedback photon integrated chaotic semiconductor laser with an air gap (Tronciu V Z, Mirasso C R, Colet P, et al. Chaos generation and synchronization using an integrated source with an air gap [J]. IEEE Journal of Quantum Electronics, 2010, 46(12): 1840-1846.); in 2011, Sunada et al. of NTT Company of Japan and Uchida of Saitama University jointly developed a novel chaotic semiconductor laser chip based on a passive ring waveguide optical feedback structure (Harayama T, Sunada S, Yoshimura K, et al. Fast nondeterministic random-bit generation using on-chip chaos lasers [J]. Physical Review A, 2011, 83(3): 031803.); in 2017, Andreas Karsaklian Dal Bosco et al. of Saitama University, Japan, Takahisa Harayama of Waseda University, Japan, and Masanobu Inubushi of NTT, Japan, developed a short-cavity photonic integrated circuit (Dal Bosco A K, Ohara S, Sato N, et al. Dynamics versus feedback delay time in photonic integrated circuits: Mapping the short cavity regime [J]. IEEE Photonics Journal, 2017, 9(2): 1-12.). Domestically, in 2013, Xia Guangqiong Research Group of Southwest University and the Key Laboratory of Semiconductor Materials Science of Chinese Academy of Sciences jointly developed a monolithic integrated semiconductor laser chip for generating a chaotic laser (Wu J G, Zhao L J, Wu Z M, et al. Direct generation of broadband chaos by a monolithic integrated semiconductor laser chip [J]. Optics express, 2013, 21 (20): 23358-23364.). It is worth noting that the monolithic integrated chaotic laser chips developed above all adopt a time-delay optical feedback structure. However, whether it is a multi-feedback cavity or a single feedback cavity, the feedback cavity length is a fixed value. The fixed feedback cavity length will cause the generated chaotic signal to carry the time-delay signature, which makes the chaotic signal have a certain periodicity. This is very disadvantageous for the application of chaotic laser in the fields of secure communication and high-speed random number generation.

In response to the above problems, in 2011, Taiyuan University of Technology proposed to use a suitable scatterer as a distributed feedback cavity of a semiconductor laser to provide continuous backscattering and amplification for the semiconductor laser, causing a random perturbation to the semiconductor laser. This method eliminates the time-delay signature of the chaotic laser by making the feedback cavity length no longer be a fixed value (see Chinese Patent: an optical feedback chaotic laser, Patent Number: ZL201110198943.6). However, the chaotic laser is constructed by using external discrete optical components, which is large in volume, susceptible to environmental influences, and unstable in output. In 2012, Dalian University of Technology disclosed an optical injection type chaotic photonic integration device and a preparation method thereof (see Chinese Patent: an optical injection type chaotic photonic integrated device, Patent Number: ZL201210349951.0), which is characterized in that continuous laser is generated by a master distributed feedback (DFB) semiconductor laser, and is amplified by a semiconductor optical amplifier (SOA) and is transmitted via a passive optical waveguide, then is injected into a slave DFB semiconductor laser, making the slave DFB semiconductor laser generate chaotic laser, wherein the SOA is a unidirectional amplifier only realizing the adjustment of single injection intensity. However, this single injection type structure is easy to generate injection locking, and the chaotic laser generated by the single injection has a narrow bandwidth, an uneven spectrum and an unstable output and often contains beat frequency information of two lasers, making typical beat frequency oscillation component arise in the spectrum of the chaotic laser (Wang A B, Wang Y C, Wang J F. Route to broadband chaos in a chaotic laser diode subject to optical injection [J]. Optics letters, 2009, 34(8): 1144-1146.). In 2014, Taiyuan University of Technology proposed a no-time-delay, flat-frequency-spectrum and broadband photonic integrated chaotic semiconductor laser (see Chinese Patent: No-time-delay, flat-frequency-spectrum and broadband photon integrated chaotic semiconductor laser, Patent Number: ZL201410435033.9). This chaotic laser is a hybrid integrated chaotic semiconductor laser. Its characteristics are that the left and right DFB semiconductor laser chips may realize the optical mutual injection process, the erbium-doped passive optical waveguide is used to provide a random optical feedback perturbation to the left and right DFB semiconductor laser chips, and the combination of the mutual injection with the random optical feedback perturbation causes the left DFB semiconductor laser chip to generate a no-time-delay, flat-frequency-spectrum and broadband chaotic laser. The production process of the hybrid integrated chaotic semiconductor laser involves flip chip technology and the like, and the flip-chip is used to couple the continuous laser emitted by the left and right DFB semiconductor laser chips with the optical waveguide, and the efficiency of such coupling is low.

SUMMARY

In order to solve the problem that the chaotic laser generated by the existing semiconductor laser has the time-delay signature and the narrow bandwidth, the present disclosure provides an InP-based monolithic integrated chaotic semiconductor laser chip capable of feeding back randomly diffused light.

The present disclosure is implemented by using an InP-based monolithic integrated chaotic semiconductor laser chip capable of feeding back randomly diffused light, comprising:

an N-type substrate;

an InGaAsP lower confinement layer epitaxially grown on the N-type substrate;

an undoped InGaAsP multiple quantum well active region layer epitaxially grown on the InGaAsP lower confinement layer;

an InGaAsP upper confinement layer epitaxially grown on the undoped InGaAsP multiple quantum well active region layer;

a heavily doped P-type InP cover layer, being ridge-shaped, and epitaxially grown in the middle of the InGaAsP upper confinement layer;

a heavily doped P-type InGaAs contact layer located on the heavily doped P-type InP cover layer;

a P+ electrode layer, which is made on the heavily doped P-type InGaAs contact layer, and is divided into four segments with three isolation grooves from left to right along an arrangement alignment of the P+ electrode layer;

an $N^+$ electrode layer made on the back surface of the N-type substrate;

wherein a first segment, a second segment, and a fourth segment of the $P^+$ electrode layer, from left to right, correspond respectively to a left DFB semiconductor laser, a bidirectional SOA, and a right DFB semiconductor laser; a third segment of the $P^+$ electrode layer from left to right sequentially corresponds to a left passive optical waveguide region, a doped passive optical waveguide region, and a right passive optical waveguide region; the first segment of the $P^+$ electrode layer serves as a positive electrode of the left DFB semiconductor laser; the second segment of the $P^+$ electrode layer serves as a positive electrode of the bidirectional SOA; the fourth segment of the $P^+$ electrode layer serves as a positive electrode of the right DFB semiconductor laser region; the InGaAsP upper confinement layer in the regions corresponding to the left and right DFB semiconductor lasers is engraved with distributed feedback Bragg gratings.

The doped passive optical waveguide region is doped with other particles, and when light is transmitted therein and interact with a doped waveguide, strong random backward scattered light is generated, thus this region is referred to as a distributed feedback cavity. However, the doping process may cause a certain diffusion phenomenon, and in order to avoid polluting the bidirectional SOA and the right DFB semiconductor laser, the doped passive optical waveguide region is grown in the middle of two segments of the undoped passive optical waveguide regions.

The left and right DFB semiconductor lasers have a length of 500 μm, providing a light emission for the entire chip, and materials of their corresponding DFB Bragg gratings respectively are InP and InGaAsP, further the DFB Bragg gratings respectively have a thickness of 50 to 100 nm and a period of 290 nm, corresponding to a lasing peak of 1550 nm band; the bidirectional SOA has a length of 200 μm and is used to bidirectionally amplify an optical signal. The left and right passive optical waveguide regions have two functions: (a) transmitting an optical signal, and (b) preventing impurities diffusion from polluting the bidirectional SOA and the right DFB semiconductor laser. The doped passive optical waveguide region has a length of 10 mm, and is doped with a certain concentration of other particles (a layer in which the doped particles is located corresponds to the undoped InGaAsP multiple quantum well active region layer), during the growth process of this region. The doped passive optical waveguide region has two functions: (a) transmitting an optical signal, and (b) serving as a distributed feedback cavity for generating random backward scattered light to provide a random optical feedback perturbation to the left and right DFB semiconductor lasers.

There is a parameter mismatch, a detuning frequency of 10 GHz to 15 GHz corresponding to center wavelengths and an output power deviation of less than 70% between the left DFB semiconductor laser and the right DFB semiconductor laser. The parameter mismatch may effectively suppress the locking synchronization effect that occurs during the mutual injection of the left DFB semiconductor laser and the right DFB semiconductor laser. The frequency difference and the power deviation between the left DFB semiconductor laser and the right DFB semiconductor laser are proposed under the consideration of multiple dimensional perturbation mode during both processes of random optical feedback and mutual injection, and they are a numerical range obtained through a large number of experiments.

A right side of the left DFB semiconductor laser is connected with a left side of the bidirectional SOA, and a right side of the bidirectional SOA is connected with a left side of the left passive optical waveguide region. A right side of the left passive optical waveguide region is connected with a left side of the doped passive optical waveguide region, and a right side of the doped passive optical waveguide region is connected with a left side of the right passive optical waveguide region. A right side of the right passive optical waveguide region is connected with a left side of the right DFB semiconductor laser. The location of the left DFB semiconductor laser and the right DFB semiconductor laser on the left side and the right side of the chip is to realize the optical mutual injection process of two DFB semiconductor lasers; and the connection of the bidirectional SOA with the left DFB semiconductor laser enables the random backward scattered light generated when the light passes through the doped passive optical waveguide region, provide the random optical feedback perturbation to the left DFB semiconductor after it is amplified by the bidirectional SOA, and finally output a chaotic signal by the left DFB semiconductor laser.

The left DFB semiconductor laser emits continuous laser, and the continuous laser is amplified by the bidirectional SOA, then is transmitted to the doped passive optical waveguide region via a segment of the left passive optical waveguide region, and then is transmitted to the right DFB semiconductor laser via the doped passive optical waveguide region and a segment of the right passive optical waveguide region, to provide an optical injection perturbation to the right DFB semiconductor laser. The right DFB semiconductor laser emits continuous laser, and the continuous laser is transmitted to the doped passive optical waveguide region via the right passive optical waveguide region, then is transmitted to the bidirectional SOA via the left passive optical waveguide region, and an optical injection perturbation is provided to the left DFB semiconductor laser by the optical signal amplified through the bidirectional SOA. So far, the process of optical mutual injection is realized. Meanwhile, after the continuous laser emitted from the left DFB semiconductor laser is amplified by the bidirectional SOA, it is transmitted to the doped passive optical waveguide region via the left passive optical waveguide region, and during its transmission in the doped passive optical waveguide region, strong random backscattered light is generated region, then the generated random backscattered light is transmitted to the bidirectional SOA via the left passive optical waveguide region, and then after it is amplified by the bidirectional SOA, the random optical feedback perturbation is provided to the left DFB semiconductor laser; when the continuous laser emitted by the right DFB semiconductor laser is transmitted to the doped passive optical waveguide region via the right passive optical waveguide region, strong random backscattered light is generated in the doped passive optical waveguide region and then is transmitted to the right DFB semiconductor laser via the right passive optical waveguide region, to provide the random optical feedback perturbation to the right DFB semiconductor laser. Because the feedback cavity is a distributed feedback cavity, it does not have a fixed feedback cavity length, so the chaotic signal without time-delay signature may be realized, and the mutual injection of two DFB semiconductor lasers may further broaden the bandwidth of the chaotic signal. The combination of the mutual injection of two DFB semiconductor lasers with the random optical feedback perturbation process, enables a no-time-delay, broadband chaotic laser signal be finally obtained and be output from the left side surface of the left DFB semiconductor laser.

In the above two processes, the bidirectional SOA is used not only to control an optical power intensity mutually injected into the left and right DFB semiconductor lasers, but also to control the random optical feedback intensity of the doped passive optical waveguide region to the left DFB semiconductor laser, and then to adjust the state of the generated chaotic laser. Meanwhile, adjusting the size of the bias current between the left and right DFB semiconductor lasers may also adjust the optical power intensity mutually injected into the left and right DFB semiconductor lasers.

Compared with the existing chaotic laser, the InP-based monolithic integrated chaotic semiconductor laser chip capable of feeding back randomly diffused light proposed by the present disclosure utilizes two processes of the mutual injection combined with the random optical feedback, effectively solving the problems that the existing chaotic laser source is bulky, the chaotic laser has a time-delay signature and the bandwidth is narrow, making the chaotic laser be more advantageous for the application of chaotic signal in the fields of secure communication, fiber fault detection, random number generation, etc., and effectively increasing the value of chaotic laser in scientific research, engineering technology and other fields.

The InP-based monolithic integrated chaotic semiconductor laser chip capable of feeding back randomly diffused light of the present disclosure has small volume and stable performance, and the combination of two processes of mutual injection and random optical feedback finally makes a no-time-delay and broadband chaotic laser signal be obtained. The monolithic integrated structure avoids the problem of low coupling efficiency of the optical waveguide and light from the hybrid integrated chaotic semiconductor laser.

The present disclosure is applicable to the fields of chaotic secure communication, chaotic laser radar, high-speed random number generation, distributed optical fiber sensing, and fiber network fault detection etc.

BRIEF DESCRIPTION OF THE DRAWINGS

FIG. 1 is a structural schematic diagram of the present disclosure.

REFERENCE SIGNS LIST

1—Left DFB semiconductor laser;
2—Bidirectional SOA;
3—Left passive optical waveguide region;
4—Doped passive optical waveguide region;
5—Right passive optical waveguide region;
6—Right DFB semiconductor laser;
7—$N^+$ electrode layer;
8—N-type substrate;
9—InGaAsP lower confinement layer;
10—Undoped InGaAsP multiple quantum well active region layer;
11—Doped particles;
12—Distributed feedback Bragg grating;
13—InGaAsP upper confinement layer;
14—Heavily doped P-type cover layer;
15—Heavily doped P-type contact layer;
16—$P^+$ electrode layer;
17—Light-emitting port;
18—Isolation groove.

DESCRIPTION OF EMBODIMENTS

Referring to FIG. 1, the present disclosure provides an InP-based monolithic integrated chaotic semiconductor laser chip capable of feeding back randomly diffused light, comprising: a left DFB semiconductor laser 1; a bidirectional SOA 2; a left passive optical waveguide region 3; a doped passive optical waveguide region 4; a right passive optical waveguide region 5; and a right DFB semiconductor laser 6, wherein the left passive optical waveguide region 3, the doped passive optical waveguide region 4 and the right passive optical waveguide region 5 are simultaneously epitaxially grown on the InGaAsP lower confinement layer 9, and then some particles are doped into the doped passive optical waveguide region 4, wherein the doped particles may be gain medium erbium particles or zinc particles, etc. Specifically, the InP-based monolithic integrated chaotic semiconductor laser chip capable of feeding back randomly diffused light comprises:

an N-type substrate 8;

an InGaAsP lower confinement layer 9 for limiting carriers and photons in vertical direction, epitaxially grown on the N-type substrate 8 and having a thickness of 80 to 200 nm;

an undoped InGaAsP multiple quantum well active region layer 10 for converting electrical energy into photons, epitaxially grown on the InGaAsP lower confinement layer 9, and having a thickness of 80 to 200 nm and a gain peak corresponding to 1310 nm or 1550 nm;

an InGaAsP upper confinement layer 13 for limiting carriers and photons in vertical direction like the InGaAsP lower confinement layer 9, epitaxially grown on the undoped InGaAsP multiple quantum well active region layer 10, and having a thickness of 80 to 200 nm;

a heavily doped P-type InP cover layer 14, being ridge-shaped, epitaxially grown in the middle of the InGaAsP upper confinement layer 13, having a ridge width of 1.5 to 2.5 pm and a thickness of 200 nm to 2000 nm, and having two functions: firstly, limiting the lateral propagation of light; secondly, burying DFB Bragg gratings 12;

a heavily doped P-type InGaAs contact layer 15 on the heavily doped P-type InP cover layer 14, having a thickness of 80 to 200 nm, and introducing heavy doping for forming ohmic contact;

a P+ electrode layer 16, wherein the P+ electrode layer 16 is made on the heavily doped P-type InGaAs contact layer 15 and is composed of 50 nm titanium and 500 nm gold, and wherein the P+ electrode layer 16 is divided into four segments by isolation grooves 18, the width of the isolation groove 18 between the left DFB semiconductor laser 1 and the bidirectional SOA 2 being 20 pm to 50 pm, the isolation grooves 18 being injected He* ions to be a high resistance region so as to realize electrical isolation between each electrode; and an N⁺ electrode layer 7 made on a back surface of the N-type substrate 8, its material being gold germanium nickel/gold, and having a thickness of 200 to 500 nm.

The left DFB semiconductor laser and the right DFB semiconductor laser have a length of 500 μm, providing optical signals for the entire chip, and the materials of their corresponding distributed feedback Bragg gratings 12 are InP and InGaAsP. The Bragg gratings have a thickness of 50 to 200 nm and a period of 290 nm, corresponding to a lasing peak of 1550 nm band. The bidirectional SOA 2 has a length of 200 μm, and the doped passive optical waveguide region 4 has a length of 10 mm. There is a parameter mismatch between the left DFB semiconductor laser 1 and the right DFB semiconductor laser 6. There is a detuning frequency of 10 GHz to 15 GHz corresponding to the center wavelengths of the left DFB semiconductor laser 1 and the right DFB semiconductor laser 6, and an output power deviation of less than 70% between the left DFB semiconductor laser 1 and the right DFB semiconductor laser 6. The parameter mismatch may effectively suppress the locking synchronization effect that occurs during the mutual injection of the left DFB semiconductor laser 1 and the right DFB semiconductor laser 6, further ensuring the no-time-delay and broadband chaotic laser to be output from the left end light-emitting port 17 of the left DFB semiconductor laser 1, and the light-emitting port is plated with an antireflection coating with a reflectance of 0.1%, which is more favorable for the output of the chaotic laser.

continuous laser is emitted from the left DFB semiconductor laser 1, and is amplified by the bidirectional SOA 2, then is transmitted to the doped passive optical waveguide region 4 via a segment of the left passive optical waveguide region 3, and then is transmitted to the right DFB semiconductor laser 6 via a segment of the right passive optical waveguide region 5 to provide an optical injection perturbation to the right DFB semiconductor laser 6. Continuous laser is emitted from the right DFB semiconductor laser 6, and is transmitted to the doped passive optical waveguide region 4 via a segment of the right passive optical waveguide region 5, then is transmitted to the bidirectional SOA 2 via the doped passive optical waveguide region 4 and a segment of the left passive optical waveguide region 3, and then is amplified by the bidirectional SOA 2 to provide an optical injection perturbation to the left DFB semiconductor laser 1. Thus the process of optical mutual injection is realized. Meanwhile, after the continuous laser emitted from the left DFB semiconductor laser 1 is amplified by the bidirectional SOA 2, it is transmitted to the doped passive optical waveguide region 4 via a segment of the left passive optical waveguide region 3, and during its transmission in the doped passive optical waveguide region 4, strong random backscattered light is generated and is transmitted to the bidirectional SOA 2 via the left passive optical waveguide region 3, and after it is amplified by the bidirectional SOA 2, the random optical feedback perturbation is provided to the left DFB semiconductor laser 1. When the continuous laser emitted by the right DFB semiconductor laser 6 is transmitted to the doped passive optical waveguide region 4 via the right passive optical waveguide region 5, strong random backscattered light is generated in the doped passive optical waveguide region 4 and then is transmitted to the right DFB semiconductor laser 6 via the right passive optical waveguide region 5, to provide the random optical feedback perturbation to the right DFB semiconductor laser 6. Because the feedback cavity is a distributed feedback cavity, it does not have a fixed feedback cavity length, so the chaotic laser without time-delay may be generated, and the mutual injection of two DFB semiconductor lasers may further broaden the bandwidth of chaotic signals.

The two processes of the mutual injection process combined with the random optical feedback is implemented simultaneously, enabling the integrated chip to generate no-time-delay and broadband chaotic laser which is output from the left end light-emitting port 17 of the left DFB semiconductor laser 1.

What is claimed is:

1. An InP-based monolithic integrated chaotic semiconductor laser chip capable of feeding back randomly diffused light, characterized in comprising: an N-type substrate; an InGaAsP lower confinement layer epitaxially grown on the N-type substrate; an undoped InGaAsP multiple quantum well active region layer epitaxially grown on the InGaAsP lower confinement layer; an InGaAsP upper confinement layer epitaxially grown on the undoped InGaAsP multiple quantum well active region layer; a heavily doped P-type InP cover layer, being ridge-shaped, and epitaxially grown in the middle of the InGaAsP upper confinement layer; a heavily doped P-type InGaAs contact layer located on the heavily doped P-type InP cover layer; a P+ electrode layer made on the heavily doped P-type InGaAs contact layer, and divided into four segments with three isolation grooves from left to right along an arrangement alignment of the P+ electrode layer; and an N+ electrode layer made on a back surface of the N-type substrate; wherein a first segment, a second segment, and a fourth segment of the P+ electrode layer, from left to right, respectively correspond to a left distributed feedback (DFB) semiconductor laser, a bidirectional semiconductor optical amplifier (SOA), and a right DFB semiconductor laser; a third segment of the P+ electrode layer, from left to right, sequentially corresponds to a left passive optical waveguide region, a doped passive optical waveguide region, and a right passive optical waveguide region; the InGaAsP upper confinement layer in the regions corresponding to the left DFB semiconductor laser and the right DFB semiconductor laser engraves distributed feedback Bragg gratings; and the doped passive optical waveguide region is doped with other doped particles.

2. The InP-based monolithic integrated chaotic semiconductor laser chip capable of feeding back randomly diffused light of claim 1, characterized in that,
the left DFB semiconductor laser and the right DFB semiconductor laser respectively have a length of 500 μm, providing optical signals for the entire chip, and materials of their corresponding DFB Bragg gratings respectively are InP and InGaAsP, further the DFB Bragg gratings respectively have a thickness of 50 to 100 nm and a period of 290 nm, corresponding to a lasing peak of a 1550 nm band; and
the bidirectional SOA has a length of 200 μm.

3. The InP-based monolithic integrated chaotic semiconductor laser chip capable of feeding back randomly diffused light of claim 1, characterized in that,
the doped passive optical waveguide region is doped with a certain concentration of the doped particles, the layer where the doped particles are located corresponds to the undoped InGaAsP multiple quantum well active region layer; and the doped particles may generate strong random backward scattered light on unit length when continuous laser passes through the doped passive optical waveguide region, to provide a random optical feedback perturbation to the left DFB semiconductor laser and the right DFB semiconductor laser.

4. The InP-based monolithic integrated chaotic semiconductor laser chip capable of feeding back randomly diffused light of claim 1, characterized in that, the doped passive optical waveguide region is doped with a certain concentration of the doped particles, the layer where the doped particles are located corresponds to the undoped InGaAsP multiple quantum well active region layer; and the doped particles may generate strong random backward scattered light on unit length when continuous laser passes through the doped passive optical waveguide region, to provide a random optical feedback perturbation to the left DFB semiconductor laser and the right DFB semiconductor laser.

5. The InP-based monolithic integrated chaotic semiconductor laser chip capable of feeding back randomly diffused light of claim 1, characterized in that, there is a parameter mismatch, and a detuning frequency of 10 GHz to 15 GHz corresponding to center wavelengths, and an output power deviation of less than 70% between the left DFB semiconductor laser and the right DFB semiconductor laser.

6. The InP-based monolithic integrated chaotic semiconductor laser chip capable of feeding back randomly diffused light of claim 2, characterized in that, there is a parameter mismatch, and a detuning frequency of 10 GHz to 15 GHz corresponding to center wavelengths, and an output power deviation of less than 70% between the left DFB semiconductor laser and the right DFB semiconductor laser.

7. The InP-based monolithic integrated chaotic semiconductor laser chip capable of feeding back randomly diffused light of claim 1, characterized in that, a right side of the left DFB semiconductor laser is connected with a left side of the bidirectional SOA, a right side of the bidirectional SOA is connected with a left side of the left passive optical waveguide, a right side of the left passive optical waveguide is connected with a left side of the doped passive optical waveguide region, a right side of the doped passive optical waveguide region is connected with a left side of the right passive optical waveguide region, and a right side of the right passive optical waveguide region is connected with a left side of the right DFB semiconductor laser, thus an optical mutual injection between the two DFB semiconductor lasers is realized.

8. The InP-based monolithic integrated chaotic semiconductor laser chip capable of feeding back randomly diffused light of claim 2, characterized in that, a right side of the left DFB semiconductor laser is connected with a left side of the bidirectional SOA, a right side of the bidirectional SOA is connected with a left side of the left passive optical waveguide, a right side of the left passive optical waveguide is connected with a left side of the doped passive optical waveguide region, a right side of the doped passive optical waveguide region is connected with a left side of the right passive optical waveguide region, and a right side of the right passive optical waveguide region is connected with a left side of the right DFB semiconductor laser, thus an optical mutual injection between the two DFB semiconductor lasers is realized.

* * * * *